US011830538B2

(12) United States Patent
Wang

(10) Patent No.: US 11,830,538 B2
(45) Date of Patent: Nov. 28, 2023

(54) APPARATUSES, SYSTEMS, AND METHODS FOR DATA TIMING ALIGNMENT IN STACKED MEMORY

(71) Applicant: MICRON TECHNOLOGY, INC., Boise, ID (US)

(72) Inventor: Baokang Wang, Kanagawa (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 118 days.

(21) Appl. No.: 17/563,863

(22) Filed: Dec. 28, 2021

(65) Prior Publication Data

US 2023/0206984 A1     Jun. 29, 2023

(51) Int. Cl.
*G11C 11/4076* (2006.01)
*H01L 25/065* (2023.01)
*G11C 11/4096* (2006.01)

(52) U.S. Cl.
CPC ...... *G11C 11/4076* (2013.01); *G11C 11/4096* (2013.01); *H01L 25/0657* (2013.01); *H01L 2225/06541* (2013.01)

(58) Field of Classification Search
CPC . G11C 11/4076; G11C 11/4096; G11C 5/025; G11C 5/063; G11C 7/1066; G11C 7/222; G11C 7/227; G11C 29/022; G11C 29/028; H01L 25/0657; H01L 2225/06541
USPC .................................................. 365/189.16
See application file for complete search history.

(56) References Cited

U.S. PATENT DOCUMENTS

| | | | |
|---|---|---|---|
| 2012/0194248 A1* | 8/2012 | Magee | G11C 7/04 327/262 |
| 2019/0303042 A1* | 10/2019 | Kim | G06F 3/0659 |
| 2021/0134336 A1 | 5/2021 | Na et al. | |
| 2022/0083260 A1 | 3/2022 | Lee et al. | |

FOREIGN PATENT DOCUMENTS

CN     111312307 A     6/2020

OTHER PUBLICATIONS

U.S. Appl. No. 18/047,950, filed Oct. 19, 2022 titled, "Apparatuses, Systems, and Methods for Data Timing Alignment With Fastalignment Mode"; pp. all pages of application as filed.
U.S. Appl. No. 17/563,878 titled "Apparatuses, Systems, and Methods for Read Clock Timing Alignment in Stacked Memory Devices" filed Dec. 28, 2021, all pages of application as filed.

* cited by examiner

*Primary Examiner* — Fernando Hidalgo
(74) *Attorney, Agent, or Firm* — Dorsey & Whitney LLP

(57) ABSTRACT

Apparatuses, systems, and methods for data timing alignment in stacked memory. The memory a number of core dice stacked on an interface die. The core and interface die each include adjustable delay circuits along each of a delay and native path. A state machine operates interface and core aligner control circuits to set values of the delay(s) in the interface and core dice respectively. The state machine may initialize the delays and then enter a maintenance state where averaging is used to determine when to adjust the delay in the core dice. If an overflow or underflow condition is met, the state machine may cycle between adjusting the delay in the interface die and adjusting the delays in the core dice without averaging until the overflow and underflow conditions are no longer met and the maintenance state is returned to.

18 Claims, 8 Drawing Sheets

APPARATUSES, SYSTEMS, AND METHODS FOR DATA TIMING ALIGNMENT IN STACKED MEMORY

BACKGROUND

This disclosure relates generally to semiconductor devices, such as semiconductor memory devices. A memory device may be a stacked memory device, in which a number of core dies, each containing a memory array are stacked on top of an interface die. The interface die may have terminals which connect to one or more external devices. The interface die may communicate with the core dies to perform various operations, such as read or write operations to the memory arrays in one or more of the core dies.

The core dies and interface die may be coupled by through silicon vias (TSVs). It may take time for information such as commands and/or data to propagate along the TSVs between the interface die and the core die. Since it may take different amounts of time to pass information to different core dice in the stack, data aligners may be used to add delays to ensure that data from different core dice is aligned in time when it arrives at the interface die.

DETAILED DESCRIPTION

Figure 1:
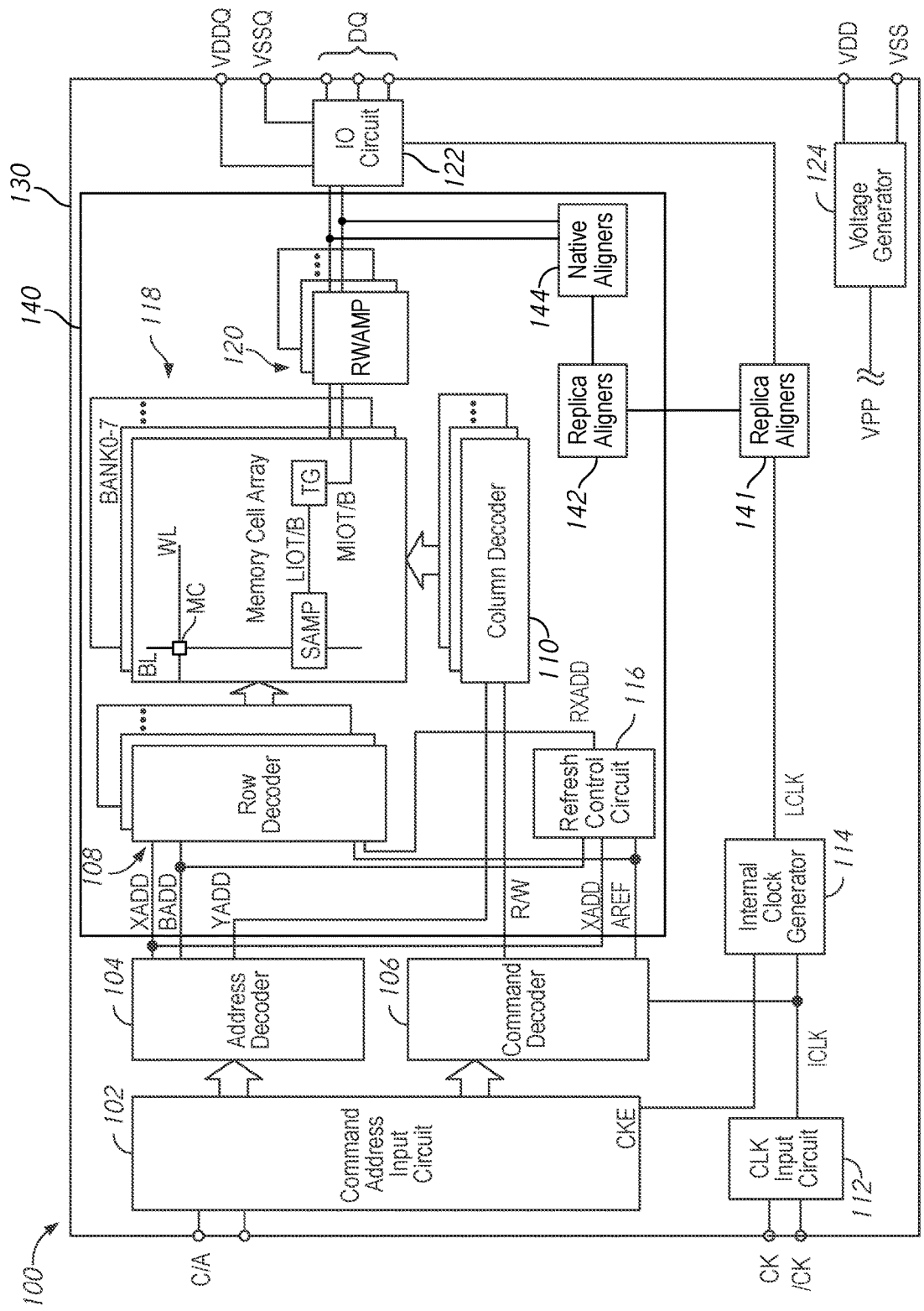
FIG. 1 is a block diagram of a semiconductor device according some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

A memory device may include a number of core dice, each including a memory array, stacked on an interface die, which communicates between external devices and the core dice. Each memory array which has a number of memory cells, each located at the intersection of a word line (row) and digit line (column). During an access operation such as a read or write operation, the interface die may receive a command and addresses which may specify memory cell(s) in one or more of the core dice. It may be important to align the timing of the data passing between the interface and core dice so that information reaches (and/or is received from) a given core die with predictable timing. Information should reach each core die (or be received from) each core die with approximately the same timing (e.g., timing which is within a tolerance of each other). However, since ach core die is a different distance from the interface die it make different amounts of time for information to pass between different core dies and the interface. To facilitate this and achieve timing alignment, alignment circuits may be used to impose delays. Different alignment circuits may be used in read and write paths of the device (e.g., there may be a read alignment circuit and a write alignment circuit). The core and interface dies may have a native path in which data and commands are transmitted, and a replica path designed to mimic the delays along the native path and used to determine a timing for alignment circuits in the native path.

In a conventional memory device, delays may need to be set based on the longest possible delay along the path to that core die. For example, in a read path, a read alignment circuit in the interface die may need to set its delay to the longest core die delay. Similarly, in a write path, each core die may need to align to a fixed delay caused by the interface die. This may be suboptimal, as this may lead to delays which are longer than needed.

The present disclosure is drawn to apparatuses, systems, and methods for data timing alignment in stacked memory. An interface die may include a delay circuit with a variable delay value. One or more core dice stacked on the interface die may each have one or more core delay circuits, each with variable delays. The interface die may include a state machine, which may use an underflow/overflow process to set alignment delays in the read and write paths of the interface die and core dice. An example alignment process may include, after progressing through an initial set of states to establish values of the delays, the state machine may repeat the adjustment of the core dice delay values using averaging to ensure that the delays are only adjusted if there is a sustained drift in the delays away from alignment. If an underflow or overflow condition (as described in more detail herein) is detected, the state machine may move to a state where the interface die's delay is adjusted (e.g., based on whether underflow or overflow is detected), and then move to a state where the core dice delays are adjusted relatively rapidly, without using averaging. These two states may repeat until the undertow or overflow condition no longer exists, and then the state machine may return to adjusting the core dice delays with averaging.

In a read path, the replica pathway includes an interface aligner control circuit which sets the delay of a replica IF alignment circuit. Each core die includes a core aligner control with a first and second aligner control circuits. These control a respective first and second aligner in the core die's replica path. The first aligner helps align the core and interface delay, while the second optimizes a set and hold time for data transfer from the core die to the interface. The state machine may operate the core aligner control to train the first and second values and apply the delay values to a first and second aligner in the native read path of the core die. In a write path, the native and replica paths of each of the core dice and the interface die may have aligner circuits. A core aligner control may set a delay in the aligners of the core die, and an IF aligner control may set a delay in the aligners of the interface die. The use of adjustable delay in the write path of the interface die may aid in controlling an amount of delay which is needed in the write path.

FIG. 1 is a block diagram of a semiconductor device according an embodiment of the disclosure. The semiconductor device 100 may be a semiconductor memory device, such as a DRAM device. The DRAM device may include an interface die and a plurality of core dice which are stacked on the interface die. In the example diagram of FIG. 1, certain components are shown located on an interface die 130, while other components are shown as part of each of the core dice 140. For the sake of clarity, only a single core die 140 and its components are shown, however, there may be multiple core die (e.g., 2, 4, 6, 8, 16, or more) each with similar components to each other. The example device 100 of FIG. 1 shows a particular arrangement of components between the interface die 130 and core die 140, however other arrangements may be used in other embodiments (e.g., the refresh control circuit 116 may be on the interface die 130 in some embodiments). For the sake of illustration, the core die 140 is drawn as a box which is smaller than the interface die 130, however the core die 140 and interface 130 may have any size relationship to each other. For example, the core die and interface die may be approximately the same size.

The semiconductor device 100 includes a memory array 118 on each of the core dice 140. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL, and a plurality of memory cells MC arranged at intersections of the plurality of word lines WL and the plurality of bit line BL. The selection of the word line WL is performed by a row decoder 108 and the selection of the bit lines BL is performed by a column decoder 110, each of which may also be located on each of the core dice. In the embodiment of FIG. 1, the row decoder 108 includes a respective row decoder for each memory bank and the column decoder 110 includes a respective column decoder for each memory bank. The bit lines BL are coupled to a respective sense amplifier (SAMP) of the memory array 118. Read data from the bit line BL is amplified by the sense amplifier SAMP, and transferred to read/write amplifiers 120 over complementary local data lines (LIOT/B), transfer gate (TG), and complementary main data lines (MIOT/B) which are coupled to a read/write amplifier (RWAMP) 120. Conversely, write data outputted from the RWAMP circuit 120 is transferred to the sense amplifier SAMP over the complementary main data lines MIOT/B, the transfer gate TG, and the complementary local data lines LIOT/B, and written in the memory cell MC coupled to the bit line BL.

The semiconductor device 100 may employ a plurality of external terminals located on the interface die 130 that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals on the interface die 130 are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The internal clocks LCLK may include a read clock (RCLK) which is used to control the timing of read operations, and write clock (WCLK) which is used to control the timing of write operations. The internal clocks may be passed both to the I/O circuits 122 and also to internal components of the core dice 140 such as the RWAMP 120. Different ones of the core dice 140 may have different amounts of time lag (e.g., due to different temperatures of the different core dice, different distances from the interface die 130 etc.). Each of the core dice 144 may have aligners along read and write native paths 144. The aligners include one or more delay circuits which may add a configurable about of delay time to the signals in the core die 140. The core die 140 may also include a replica path 142, which may be used to measure the amount of delay in that die. The replica path may also include delay circuits which may be adjusted to determine a proper length of delay. The interface die 130 also includes replica aligners 141. The replica aligners 141 on the interface die 130 may act as the primary aligners during timing alignment, and the aligners 142 and 144 of the core dice 130 may act as secondary aligners. The replica aligners 141 on the interface die 130 may include various control circuits such as a state machine to operate an alignment process. Information about the delays in the replica path may be used to adjust delays both in the native path in the aligner circuit(s) of the interface die (e.g., in the internal clock generator 114). The details of aligning the timing of the core and interface die will be described in more detail herein.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the ECC control circuit 120. The read command may also cause one or more parity bits associated with the read data to be provided along the MIOT/B to the ECC control circuit 120. The ECC control circuit 120 may use the parity bits to determine if the read data includes any errors, and if any errors are detected, may correct them to generate corrected read data (e.g., by changing a state of the identified bit(s) which are in error). The corrected read data is output to outside the device 100 from the data terminals DQ via the input/output circuit 122.

The device 100 may receive an access command which is a write command. When the write command is received, and a bank address, a row address and a column address are timely supplied with the write command, and write data is supplied through the DQ terminals to the ECC control circuit 120. The write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the ECC control circuit 120. The ECC control circuit 120 may generate a number of parity bits based on the write data, and the write data and the parity bits may be provided to the memory array 118 to be written into the memory cells MC.

The device 100 may also receive commands causing it to carry out one or more refresh operations as part of a self-refresh mode. In some embodiments, the self-refresh mode command may be externally issued to the memory device 100. In some embodiments, the self-refresh mode command may be periodically generated by a component of the device. In some embodiments, when an external signal indicates a self-refresh entry command, the refresh signal AREF may also be activated. The refresh signal AREF may be a pulse signal which is activated when the command decoder 106 receives a signal which indicates entry to the self-refresh mode. The refresh signal AREF may be activated once immediately after command input, and thereafter may be cyclically activated at desired internal timing. The refresh signal AREF may be used to control the timing of refresh operations during the self-refresh mode. Thus, refresh operations may continue automatically. A self-refresh exit command may cause the automatic activation of the refresh signal AREF to stop and return to an IDLE state. The refresh signal AREF is supplied to the refresh control circuit 116. The refresh control circuit 116 supplies a refresh row address RXADD to the row decoder 108, which may refresh one or more wordlines WL indicated by the refresh row address RXADD.

The power supply terminals are supplied with power supply potentials VDD and VSS. The power supply potentials VDD and VSS are supplied to an internal voltage generator circuit 124. The internal voltage generator circuit 124 generates various internal potentials such as VPP, VOD, VARY, VPERI, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
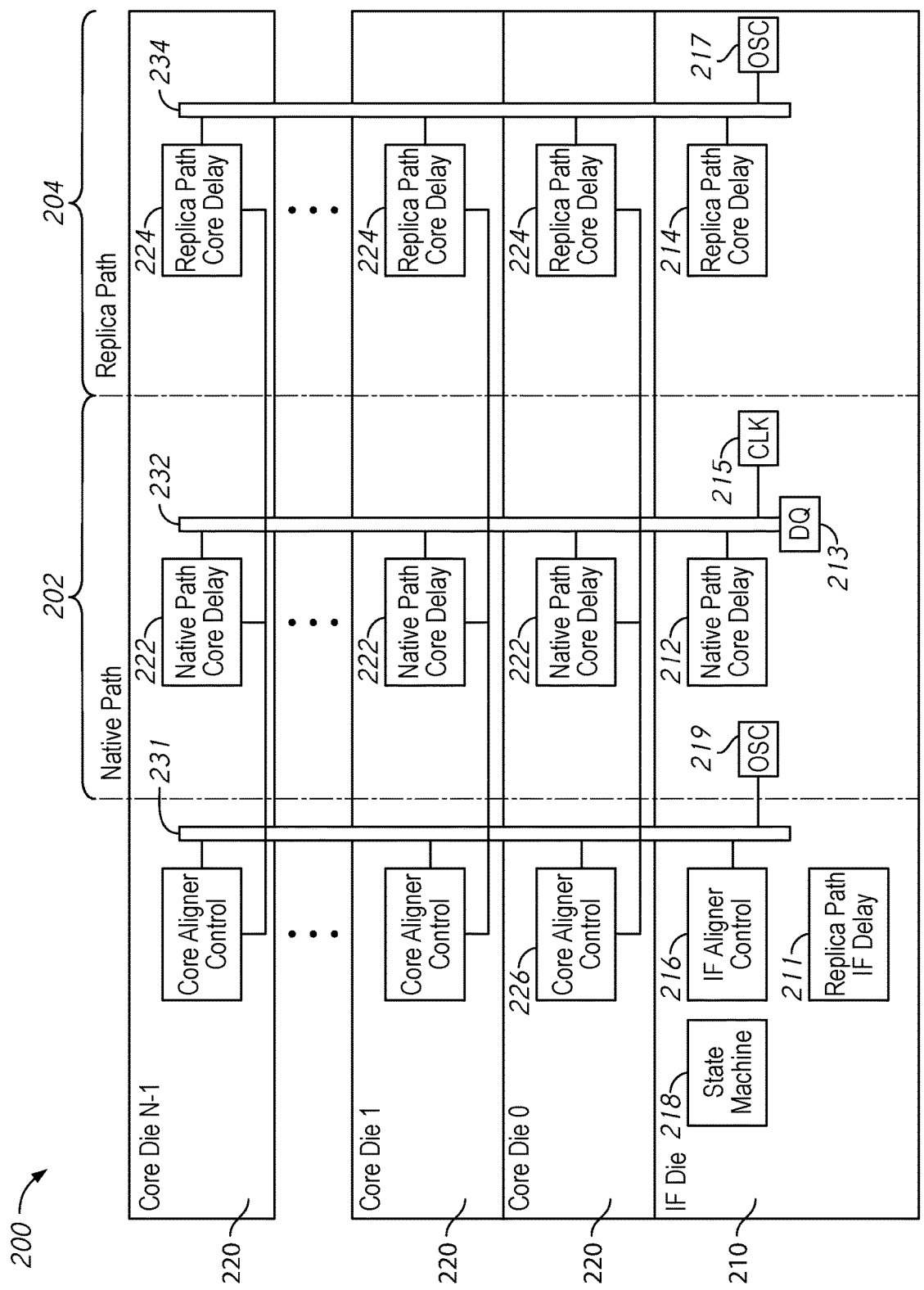
FIG. 2 is a block diagram of a memory device according to some embodiments of the present disclosure.

FIG. 2 is a block diagram of a memory device according to some embodiments of the present disclosure. The memory device 200 may, in some embodiments, represent a cross sectional view of a memory device such as the device 100 of FIG. 1. The memory device 200 includes an interface (IF) die 210, and a number of core dice 220 which are stacked on the interface die 210. Here the core dice 220 are labelled core die 0 through core die N−1 for a total of N core dice.

The interface die 210 may have a number of terminals to couple the device 200 to external devices. For example, the interface die 210 may include terminals such as clock terminals, power terminals, data terminals DQ 213, command terminals, etc. The core dice 220 may be coupled to the interface die 210 by one or more through silicon vias (TSVs) which may penetrate the stack and carry commands, signals, and/or data between the core dice 220 and the interface die 210. In FIG. 2, three sets of TSVs are shown, control path TSV 231, native path TSVs 232, and replica path TSVs 234. The TSVs 231, 232 and 234 include one or more signal lines which connect the different dice of the device 200 to each other. While the control path TSVs 231, native path TSVs 232 and replica path TSVs 234 are shown separately, in some embodiments, certain signal lines may be shared between the two TSV groups.

As may be seen, dice which are higher in stack (e.g., Core Die N−1) can be further from the interface die 210 than dice which closer (e.g., Core Die 0). In addition, different core dice 220 may have different temperatures, manufacturing variations etc which may also adjust the travel time of information such as signals and data between the core die 220 and the interface die 210. There may thus be different propagation times between the interface die 210 and different ones of the core dice 220. To prevent misalignment of signals and/or data being conveyed in the device 200, aligner circuits may be used to provide adjustable delays along native signal paths 202 in the core dice 220 and interface die 210. These delays may be adjusted based on measured signal alignment along a replica path 204, which may include circuits meant to mimic the timing along a native path 202.

The native path 202 may include native path TSVs 232 which convey information (e.g., signals such as commands and clock signals and data) between the memory arrays of the core dice 220 and the interface die 210. The replica path 204 may include replica path TSVs 234 and other circuits which are meant to mimic an amount of time it takes signals and data to propagate along the native path 202. Both the native path 202 and the replica path 204 may also include variable delay circuits which may be adjusted to align signal and data propagation time between the different core dice 220. For example, the native path 202 includes native path delay circuits 222 in the core dice 220 and native path delay circuits 212 in the IF die 210, while the replica path 204 includes replica path delay circuits 224 in the core dice 220 and replica path delay circuits 214 in the IF die 210. The interface die 210 may also include additional replica delay circuits 211, which may aid in the alignment of the control circuits 216 and 226. For example, the replica path delay 211 may be compared to the replica path delay 214 to determine which is faster. The IF aligner control 216 may calculate and update delays based on the signals from the interface die 210 such as from oscillator 219, and then update the delays in the native path 202 and replica path 204.

Each of the delay circuits 211, 212, 222, 214, and 224 may include one or more variable delay circuits which may be adjusted based on a control circuit. An IF aligner control 216 may control adjustments in the delay circuits 212 and 214 of the IF die 210, while core aligner controls 226 may control adjustments in the delay circuits 222 and 224 of the core dice 220. For the sake of clarity, signal lines have been simplified and/or omitted in FIG. 2 which show how the aligner control circuits 216 and 226 are coupled to the delay circuits 212, 222, 214, and 224. Example couplings are described in more detail in FIGS. 3 and 4.

The control TSVs 231 may be used to convey information between the control circuits 216 and 226 and the state machine 218. For example the control TSVs 231 may be used to convey information such as signals which indicate which state the state machine 218 is in, identification info which indicates which of the core dice 220 is being adjusted, and/or other related signals.

As shown in the example of FIG. 2, the native path 202 includes data terminals DQ 213, which are coupled to memory arrays in the core dice 220 by the native path TSVs 232. The native path TSVs 232 also distribute clock signals from a clock circuit 215 (e.g., internal clock generator 114 of FIG. 1), which may generate internal clock signals based on an external clock (not shown). The clock signals provided by the clock circuit 215 may control the timing of operations between the interface die 210 and the core dice 220. The replica path 204 may include replica path TSVs 234 which provide an oscillator signal OSC from an oscillator circuit 217 of the interface die 210 to delay circuits 224 of the core dice 220. The oscillator signal may be passed through one or more delay circuits 214 and 224. The state machine 218 may adjust the delays in the delay circuits 214 and 224 of the replica path 204 and measure an alignment of the oscillator signal. Based on that values in the replica path 204 which bring alignment, the delay values in the native path 202 may also be adjusted. For example, the delay values may be matched between the replica and native paths.

In an example write operation, data may be provided at the DQ terminal 213 and then passed along the TSVs 232 to one or more selected ones of the core dice 220. The clock circuit 215 may provide a write clock, which may be adjusted by the native path interface delay to provide a delayed interface write clock. The delayed interface write clock may be used to determine the timing with which the data from the DQ pads 213 is provided along the TSVs 232 to the selected one(s) of the core dice 220. The write clock may also be passed up the TSVs 232 to the native path core delay circuits 222 in the selected one(s) of the core dice 220, which may provide core delayed write clock signal(s). The core delayed write clock signals may determine the timing with which the data along the TSVs 232 is received. Based on the propagation of the oscillator signal OSC from the oscillator circuit 217, the state machine 218 may adjust the delays in the native path 202 to ensure that the write data reaches the memory array in alignment with the write clock.

A state machine 218 in the interface die 210 operates control circuits 216 and 226 in the interface 210 and core dice 220 respectively. The control circuits 216 and 226 may adjust delays in replica paths 214 and 224 of their respective dies and measure the alignment of signals (e.g., measure a phase difference between signals). The state machine 218 may control which circuits and which delays are being adjusted and monitor the measured alignments. The delays set in the replica path 204 may also be applied to the alignment circuits 212 and 222 in the native path 202. Once the measured alignments are within tolerances, the delays may bring the device 200 into timing alignment. Each of the core dice 220 and the IF die 210 may have different delays from each other.

The state machine 218 may update the delay values as part of an ongoing process in the memory device 200. For example, the state machine 218 may use an initial set of states to establish delays in the interface aligner control circuit 216 and in each of the core aligner control circuits 226. After the initial states, the state machine 218 may operate a maintenance state which keeps the delays in alignment. To prevent unnecessary adjustment, the maintenance state may use averaging to determine when a delay value has shifted out of alignment. The state machine 218 may also define underflow and overflow limits. When one of these limits is exceeded, the state machine 218 may shift to a rapid alignment mode, including a state where the delay in the interface aligner control 216 is adjusted, followed by a process where the delays in the core aligner control circuits 226 in each of the core dice 220 is adjusted without averaging. Once the state machine 218 determines that the overflow/underflow conditions are no longer met, the state machine 218 may return to the maintenance state.

In some embodiments, the delays in the native path circuits 212 and 222 and in the replica path delay circuits 214 and 224 may be divided between a read path and a write path. For example, the delay circuits may each include one or more read path delay circuits and one or more write path delay circuits, each of which may have their own separate delay values. Similarly, the state machine 218 may have a first process for setting values in the read path and a second process for setting delay values in the write path.

Figure 3:
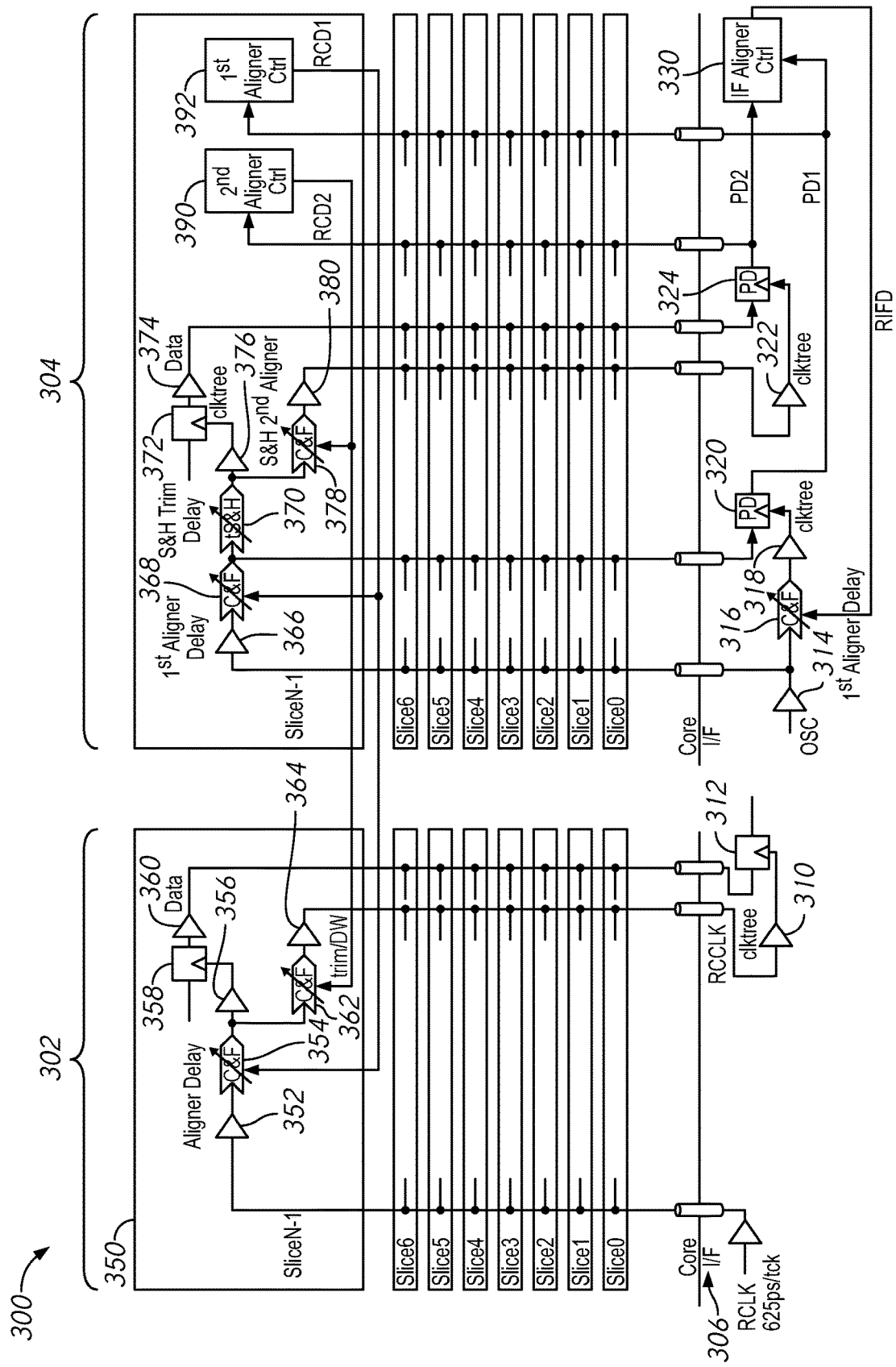
FIG. 3 is a schematic diagram of a read path according to some embodiments of the present disclosure.

FIG. 3 is a schematic diagram of a read path according to some embodiments of the present disclosure. The device 300 may be an implementation of the device 200 of FIGS. 2 and/or 100 of FIG. 1. The device 300 includes an interface die 306 and a plurality of stacked core dice. In the example of FIG. 3, only a single core die 350 (core die Slice N−1) is described in detail. However each of the core dice may have similar components and operations to the described core die 350. The device 300 shows components used in the timing alignment of signals and data during a read operation. Some of the components shown in FIG. 3 may also be used in other operations (e.g., write operations). For example, the aligner control circuits 390 and 392 may be part of an aligner control circuit (e.g., 226 of FIG. 2) which manages delays in a write path. Similarly, the aligner control circuit 330 may be part of an aligner control circuit (e.g., 216 of FIG. 2) which manages delays in the write path.

The interface die 306 and core die 350 include a native path 302 and a replica path 304 (e.g., native path 202 and replica path 204 of FIG. 2). The native path is used to provide signals and data. In this case a read command is provided to the interface die 306 which passes the read command to the indicated core die 350 along a TSV path. The core die 350 retrieves the data from the memory array and provides the data back along a TSV path to an output latch 312 on the interface die 306, which can then provide the data to output terminals (e.g., DQ terminals) or other output circuitry. In addition to the native path 302, the core die 350 and IF die 306 also include a replica path 304, which include circuits which may be used to mimic and measure delay times which simulate those between the interface die 306 and core die 350 in the native path 302. Aligner control circuits 330, 390, and 392 may use measurements of the data alignment along the replica path 304 to set variable delays in the native path 302.

The native path 302 of the interface die 306 includes a buffer circuit 308 which receives a read clock signal RCLK as part of a read operation. The read clock RCLK may be used to time receipt of data retrieved from the core die 350, which may be indicated by an address. The buffer circuit 308 provides the read clock RCLK along a TSV stack to the core die 350. In the native path 302 of the core die 350, a buffer 352 receives the read clock RCLK and provides it to a first native delay circuit 354. The first native delay circuit 354 may provide a delayed read clock based on an adjustable amount of delay, controlled by the signal RCD1 provided by the first aligner control circuit 392. The first native delay circuit 354 may be a coarse and fine adjustment circuit. In a coarse and fine adjustment circuit different numbers of gates may be activated to adjust the delay. Some gates may have a relatively long delay time (coarse adjustment) while others may have a relatively short delay time. For example, each activated coarse gate may have about 10 times the delay of an activated fine gate. By controlling a number of coarse and fine gates which are active, the amount of delay in the first native delay circuit 354 may be controlled. A first aligner control circuit 392 provides a control signal RCD1 which determine a total delay time of the first native delay circuit 354 by determining how many (and which type) of gates are active. The control signal RCD1 may have a coarse portion which specifies a number of active coarse gates, and a fine portion which specifies a number of active fine gates.

The first native delay circuit 354 provides the delayed read clock to a clock tree 356 and a second native delay circuit 362. The clock tree 356 distributes the delayed read clock to various circuits of the memory. For clarity of illustration, only a single path of the clock tree 356 is shown, from the first native delay circuit 354 to a local latch 358. However it should be understood that the clock tree 356 may distribute the signal to many other circuits of the core dice 350 (e.g., other local latches). The local latch 358 has an input terminal coupled to the memory array to receive data read from the memory array (not shown). The data may be provided based on commands received at the interface die 306 and passed to the core die (e.g., a read command, column, row, and bank address). The local latch 358 has a clock terminal coupled to the output of the clock tree 356. The local latch 358 latches the data read from the memory array with timing based on the delayed read clock which was delayed by the first native delay circuit 354 and distributed by the clock tree 356. The data in the local latch 358 is provided through a buffer circuit 360 through a TSV stack to an output latch 312.

The second native delay circuit 362 receives the delayed read clock from the first native delay circuit 354. The second native delay circuit 362 may also be a coarse and fine (C&F) type delay circuit with an adjustable amount of delay controlled by a signal RCD2 provided by the second aligner control circuit 390. Similar to the other C&F type delay circuits, the second native delay circuit 362 may receive a control signal (e.g., RCD2) which includes both coarse and fine delay values, which specify a number of coarse and fine gates to activate. The second native delay circuit 362 provides a delayed read clock RRCLK through a buffer 364 to a TSV stack after an amount of time determined by RCD2. The delayed read clock RRCLK is passed along the TSV stack back to the interface die 306, where a clock tree 310, analogous to the clock tree 356 of the core die 350, distributes the clock RRCLK to the output latch 312.

The output latch 312 has a data terminal coupled to a TSV stack which provides the data which was read from the memory array and stored in the local latch 358. The output latch 312 has a clock terminal which receives the delayed clock signal RRCLK from the clock tree 310. Although not shown in FIG. 3, the output latch 312 may provide the data to output circuits and/or DQ terminals (e.g., DQ terminals 213 of FIG. 2).

The replica path 304 may generally be similar to the native path 302 in order to mimic the delays of the signals RCLK and RRCLK and the data. In the replica path, the interface die 306 provides an oscillator signal OSC (e.g., from an oscillator circuit such as 217 of FIG. 2). The oscillator signal OSC may mimic a clock signal such as the read clock RCLK. The oscillator signal OSC is pass through a buffer circuit 314 (e.g., similar to buffer 308) through a TSV stack to the core die 350. The buffer 314 also provides the signal OSC to an interface delay circuit 316. The interface delay circuit 316 has a variable amount of delay which is determined by a control signal IFD provided by an interface aligner control circuit 330 in the interface die 306. The interface delay circuit 316 provides a delayed oscillator signal through a clock tree 318 (e.g., similar to clock tree 310 of the native path 302) to a first phase detector 320.

In the core die 350, a buffer circuit 366 passes the oscillator signal OSC from the interface die 306 to a first replica delay circuit 368. The first replica delay circuit 368 may be a coarse and fine delay circuit which mimics the behavior of the first native delay circuit 354, and which may be generally similar to the first native delay circuit 354. The first replica delay circuit 368 also has a variable amount of delay which is controlled by the signal RCD1 provided by the first aligner control circuit 392. The first replica delay circuit 368 provides a delayed oscillator signal along a TSV stack back to the first phase detector 320 in the interface die 306.

The first phase detector 320 measures a phase difference between the oscillator signal which was delayed by the interface delay circuit 316 and the delayed oscillator signal from the first replica delay circuit 368. The first phase detector 320 provides a measured phase difference signal PD1. The first aligner control circuit 392 and the interface aligner control circuit 330 use the measured phase difference signal PD1 to set the values of the signals RCD1 and IFD as explained in more detail herein.

The first replica delay circuit 368 also provides the delayed oscillator signal to a trim delay circuit 370 of the core die 350. The trim delay circuit 370 may have an adjustable amount of delay which is set to trim the operation of the replica path 304. For example, trim fuses may be used to set the delay of the trim delay circuit 370. The trim delay circuit 370 may be a set and hold delay circuit. The trim delay circuit 370 provides the delayed oscillator signal to a clock tree 376, which distributes the signal to a local latch 372. The local latch 372 uses the delayed oscillator signal to clock data which is stored from the memory array and then provided through a buffer to the interface due 306. The clock tree 376, local latch 372, and buffer 374 may be analogous to the clock tree 356, local latch 358, and buffer 360 of the native path 302.

The trim delay circuit 370 provides the delayed oscillator signal to a second replica delay circuit 378. The second replica delay circuit 378 has a variable amount of delay controlled by the signal RCD2 from the second aligner control circuit 390. The second replica delay circuit 378 may be a coarse and fine adjustment circuit. The second replica delay circuit 378 provides the delayed oscillator signal through a buffer 380 back along a TSV stack to a clock tree 322 in the interface due 306. The clock tree 322 provides the delayed oscillator signal to a second phase detector 324. The second phase detector 324 also receives the data from the local latch 372 which was clocked by the oscillator signal delayed by the first replica delay circuit 368 (and the trim delay circuit 370). The phase detector 324 provides a signal PD2 based on a measured phase difference between the delayed clock oscillator signal and the data. The signal PD2 is used by the interface aligner control 330 (along with the signal PD1) to set a value of the interface delay IFD, and is used by the second aligner control circuit 390 to set a value of the control signal RCD2, as described in more detail herein.

Figure 4:
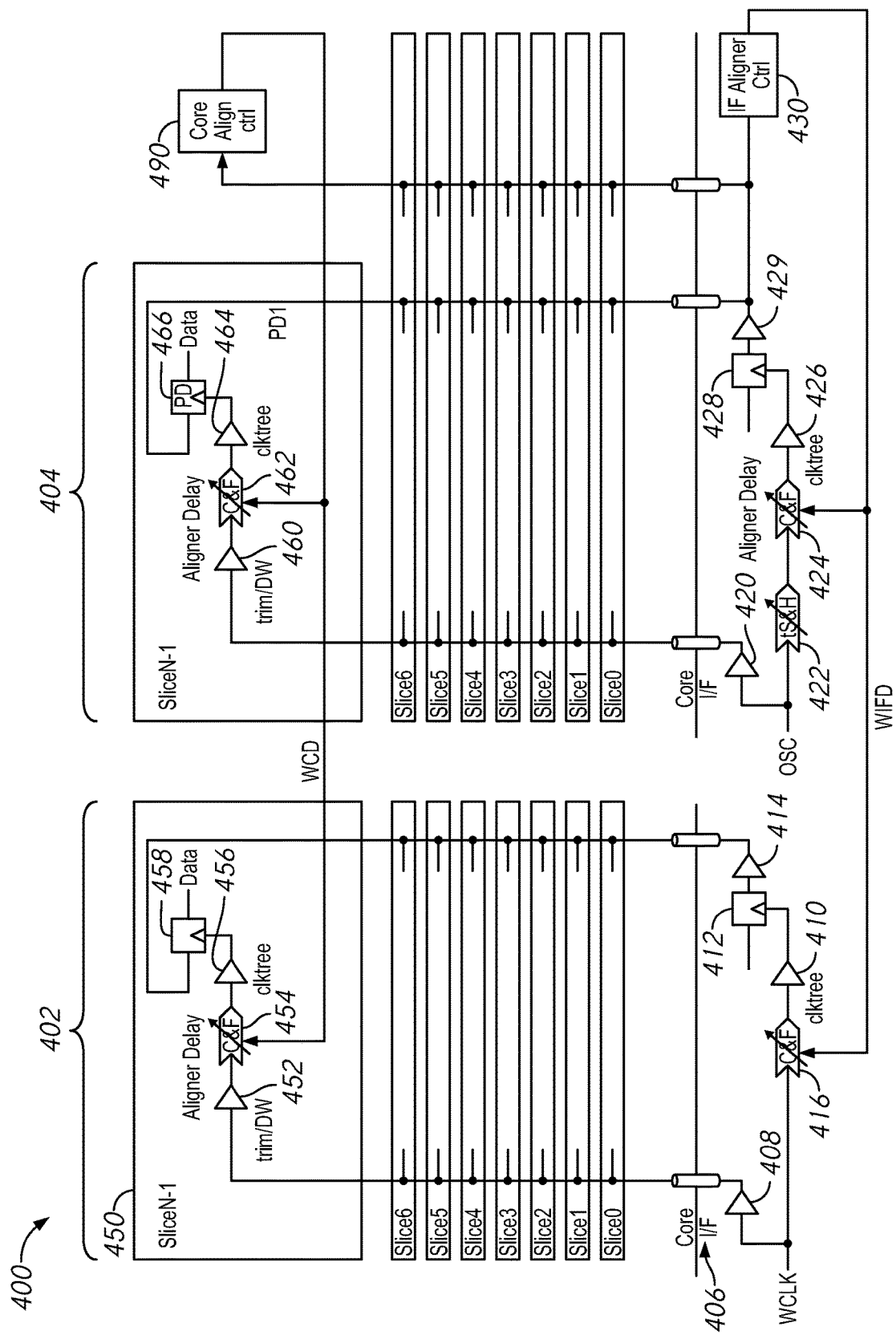
FIG. 4 is a schematic diagram of a write path according to some embodiments of the present disclosure.

FIG. 4 is a schematic diagram of a write path according to some embodiments of the present disclosure. The device 400 may be an implementation of the device 200 of FIGS. 2 and/or 100 of FIG. 1. The device 400 includes an interface die 406 and a plurality of stacked core dice. In the example of FIG. 4, only a single core die 450 (core die Slice N–1) is described in detail. However each of the core dice may have similar components and operations to the described core die 450. FIG. 4 may show different components of the same device 300 of FIG. 3 in some embodiments. The device 400 shows components used in the timing alignment of signals and data during a write operation. Some of the components shown in FIG. 4 may also be used in other operations (e.g., read operations). For example, the core aligner control circuit 490 may be part of the same aligner control circuit (e.g., 226 of FIG. 2) as the core aligner control circuits 390 and 392 of FIG. 3. Similarly, the interface aligner control circuit 430 may be part of the same interface aligner control circuit (e.g., 216 of FIG. 2) as the interface aligner control circuit 330 of FIG. 3.

The device 400 includes a native path 402 and a replica path 404 which mimics a delay time of the native path 402. The native path 402 includes various components which are used to pass data and timing signals (such as write clock WCLK) to a core die so that the data can be written to a memory array (not shown) of the core die 350. The replica path 404 includes components meant to mimic the delay along the native path 402. Delays along the replica path 404 are measured, and used by core and interface aligner control circuits 490 and 430 respectively to determine the length of variable delays in the native path 402.

The interface die 406 receives a write WCLK as part of a write operation. The write clock WCLK may be active during the write operation, and may control a timing with which the write operation is performed. The write clock WCLK is provided to a native interface delay circuit 416 in the native path 402 and through a buffer 408 to a TSV stack to the core die 450.

The native interface delay circuit 416 may be a coarse and fine adjustment circuit. In a coarse and fine adjustment circuit different numbers of gates may be activated to adjust the delay. Some gates may have a relatively long delay time (coarse adjustment) while others may have a relatively short delay time. For example, each activated coarse gate may have about 10 times the delay of an activated fine gate. By controlling a number of coarse and fine gates which are active, the amount of delay in the native interface delay circuit 416 may be controlled. An interface aligner control circuit 430 provides a control signal WIFD which determines a total delay time of the native interface delay circuit 416 by determining how many (and which type) of gates are active.

In a similar manner, in the native path 402 of the core die 450, the write clock WCLK is provided through a buffer 452 to a native core delay circuit 454. The native core delay circuit 454 may also be a course and fine adjustment circuit, similar to the native interface delay circuit 416. The native core delay circuit 454 has a variable delay which is set by a signal WCD provided by a core alignment control circuit 490 of the core die 450.

In the native path 402 of the interface die 406, the delayed write clock WCLK is provided by the native interface delay circuit 416 through a clock tree 410 to the clock terminal of an input latch 412. The clock tree 410 distributes the delayed write clock to various circuits of the interface die 406. For clarity of illustration, only a single path of the clock tree 410 is shown, from the native interface delay circuit 416 to an input latch 410. However it should be understood that the clock tree 410 may distribute the signal to many other circuits of the interface die 406 (e.g., other input latches). The input latch 412 may latch data (e.g., provided through input circuits such as the DQ terminals) with timing based on the delayed write clock provided through the clock tree 410. The input latch 412 provides that write data through a buffer circuit 414 along a TSV stack to a local latch 458 of the core die 450

In the native path 402 of the core die 450, the native core delay circuit 454 provides the delayed write clock through a clock tree 456 (e.g., similar to the clock tree 410) to a clock terminal of the local latch 458. Accordingly, the data provided from the input latch 412 is latched in the local latch 458 of the core die with timing determined, in part, by the write clock delayed through native core delay circuit 454. The data in the local latch 458 may then be written to a memory array (not shown) of the core die 450.

In the replica path 404, the interface die 406 may generate an oscillator signal OSC, which mimics the write clock WCLK. The oscillator signal is to a trim delay circuit 422. The trim delay circuit 422 may be a set and hold (S&H delay circuit) and may have an amount of delay as a setting of the memory device 400, for example as set by a trim fuse setting. The trim delay circuit 422 provides the oscillator to a replica interface delay circuit 424, which may be similar to the native interface delay circuit 416. The replica interface delay circuit 424 may be a coarse and fine delay circuit, and has an amount of delay controlled by the signal WIFD provided by the interface aligner control circuit 430. The replica interface delay circuit 424 provides the delayed oscillator signal through a clock tree 426 (e.g., similar to clock tree 410) to a latch 428. Based on the timing of the delayed oscillator signal, the latch 428 latches data, which it provides through buffer 429, along a TSV stack up to a phase detector 466 in the replica path 404 of the core die 450.

In the replica path 404 of the core die 450, the oscillator signal OSC is received through a TSV stack (after passing through buffer 420 in the interface die 406). The oscillator signal OSC is passed through buffer 460 in the core die 450 to a replica core delay circuit 462. The replica core delay circuit 462 may be a coarse and fine delay circuit, and has an amount of delay controlled by the signal WCD provided by the core aligner control circuit 490. The replica core delay circuit 462 passes the delayed signal through a clock tree 464 (e.g., similar to clock tree 456) to phase detector 466. The phase detector 466 provides a signal PD1 which is used by the core alignment control circuit 490 and the interface alignment control circuit 430 to set the values of WCD and WIFD respectively, as described in more detail herein.

In the write path of FIG. 4, the interface die 406 may be considered as providing data, and the core dice 450 may act as clock signals for that data along the write path. Accordingly, the phase difference signal PD1 is set by the phase detectors 465 in the core dice 450. The phase detector 465 receives the signal from the latch 428 and provides the result signal PD1 to both the core dice 450 and interface die 406. In some embodiments, the PD1 signal may share a TSV with an overflow/underflow signal which indicates whether the IF aligner control circuit 430 detects an overflow or underflow condition (as described in more detail herein). For example, on coarse align and fine align states, the TSV receives the signal PD1 and provide it to the interface die 406 while on an overflow/underflow state, the TSV receive an overflow/ underflow signal and provides it to interface die 450.

FIGS. 5-8 are diagrams which illustrate a method of setting the alignments between the interface and core dice of a memory device, such as the memory devices 100, 200, 300, and 400 of FIGS. 1-4. The example method of FIGS. 5-8 will be described with respect to aligning delay circuits of the read path. However, the method may be generally similar for aligning the delays in the write path. The process of aligning delays in the core and interface dice may be iterative. The method may be divided into a number of different steps, and be controlled by a state machine (e.g., 218 of FIG. 2). In each step, the aligner control circuit (e.g., 330, 390, and/or 392 of FIG. 3) may change a value of their respective delay signal (e.g., RIFD, RCD1, and/or RCD2) and measure how that changes a value of the measured alignment (e.g., as indicated by PD1 and PD2). Based on that change, the aligner control circuits may continue to change the delay value, or if the measured alignment is within a tolerance, move on to another step. Some steps may be repeated a number of times. Some steps may be entered or exited only if certain conditions are met. Some aspects of the method may be controlled by settings of the device (e.g., if the device is set in a first mode, a given step may be skipped).

Figure 5:
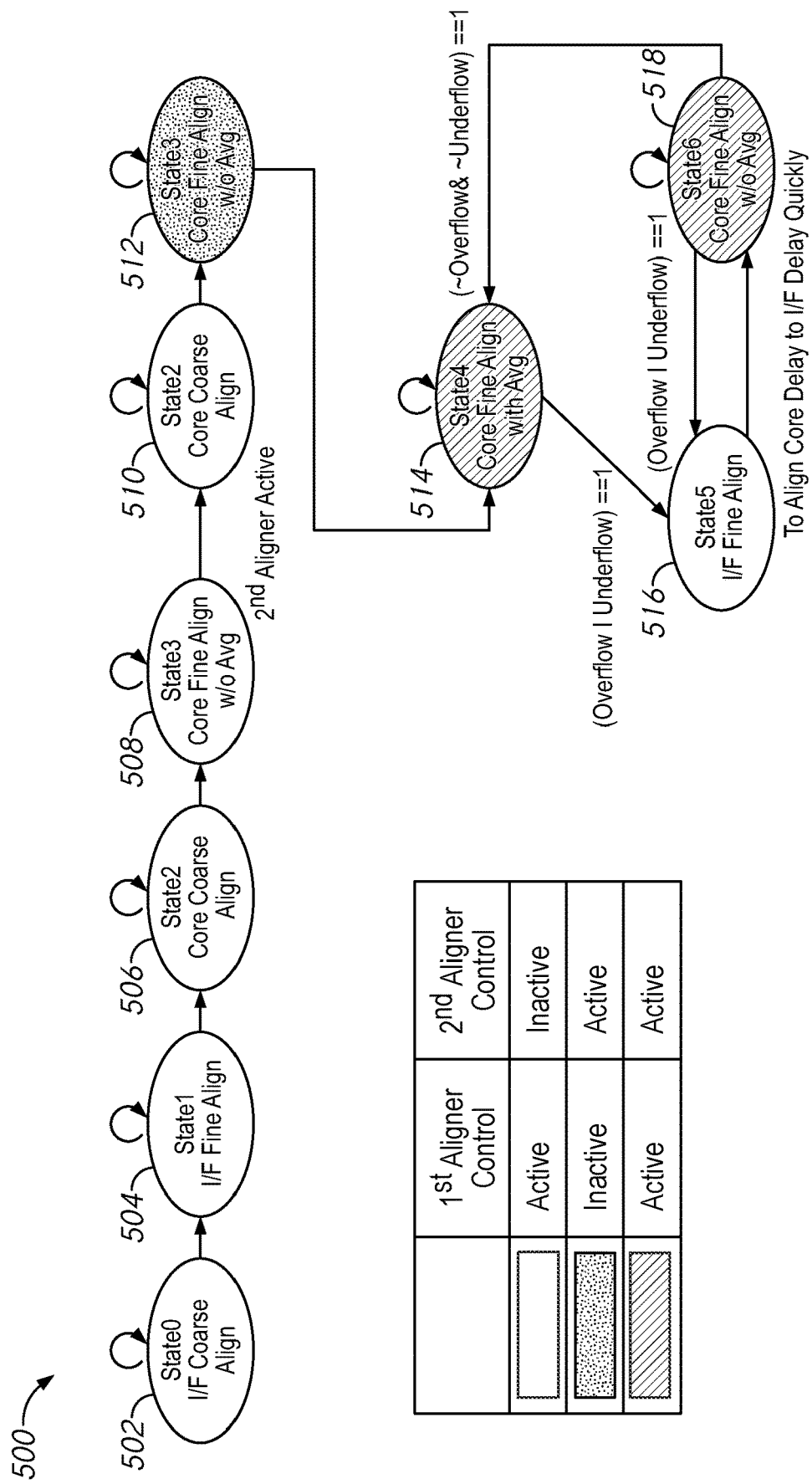
FIG. 5 is a state diagram of a method of aligning the delays in a read path of a memory device according to some embodiments of the present invention.

FIG. 5 is a state diagram of a method of aligning the delays in a read path of a memory device according to some embodiments of the present invention. The method 500 may be implemented by any of the devices described in FIGS. 1-4. For example, the method 500 may be implemented by a state machine (e.g., 218 of FIG. 2) by controlling aligner delay circuits in a memory device, such as the one shown in FIG. 3. Reference is made to the component reference numbers and signals described with respect to FIG. 3. The method 500 includes a number of states 502-518, each of which includes one or more steps for adjusting delay values in the memory. For reference the states have been given labels (e.g., State0, State1, etc.), however these labels are for reference only and do not necessarily imply a required order in which the states be performed. Some state names may be repeated to represent similar operations (e.g., state2 506 and state2 510 are both coarse alignments of a core die, but adjust the first and second delay value respectively).

In the diagram of FIG. 5, the states are shaded to indicate which of the aligner control circuits is active in a given state. For example, in states0 to state3 502-508 and state5 516, the first aligner control circuit 392 is active, while the second aligner control circuit 390 is inactive. In state2 510 and state3 512, the second aligner control circuit 390 is active while the first aligner control circuit 392 is inactive. In state4 514 and state6 518, both the first and the second aligner control circuits are active.

The method 500 may be started as part of an initialization of the memory device. The method 500 may begin with a first state, state0 502 proceed through initialization states state1 504 to state3 512 and then remain in a cycle between state4 to state6 514, 516, and 518 to maintain an alignment as the device runs. In some embodiments, the method 500 may be repeated when the device restarts and/or is reset.

The method 500 includes a first state0 502, in which a coarse delay of the replica interface delay circuit 316 is adjusted by the interface aligner control circuit 330. The control signal RIFD may include a value which indicates a number of coarse gates which are active and a value which indicates a number of fine gates which are active. In the state0 502, only the coarse value of the signal RIFD is changed. The interface aligner control circuit 330 may adjust the coarse value of RIFD in a stepwise fashion (e.g., by adding or subtracting one active gate each time). For example, the interface aligner control circuit 330 may adjust the coarse value of RIFD to add an additional gate. If the signal PD1 indicates the delay is too short, then in a next step an additional coarse gate may be activated. If the signal PD1 indicates the delay is too long, then in a next step a coarse gate may be inactivated. In some embodiments, the state 502 may be repeated a set number of times (e.g., once, twice, three times, or any other number of times). In some embodiments, the state 502 may be run until some criteria is met, for example, until the measured value of PD1 is within a given threshold value.

State0 502 may be followed by state1 504, which describes performing a fine alignment of the interface delay circuit 316. The state1 504 may be similar to the state0 502, except that instead of adjusting a coarse value of RIFD (e.g., activating or deactivating the coarse gates of the interface delay circuit 316), the fine value of RIFD may be changed to adjust a number of fine gates which are active in the delay circuit 316. As described previously, each active fine gate may add a smaller amount of delay time than each active coarse gate.

State1 504 may be followed by state2 506, which describes performing a coarse adjustment of the first core delay circuit 368 and 354 in each of the core dice. Similar to the coarse adjustment of the interface delay circuit 316 in state0 502, state2 506 describes a coarse adjustment of the first delay circuit in the core die. In some embodiments, each core die may be adjusted one at a time. For example, the first aligner control circuit 392 may adjust a coarse value of RCD1 in a manner similar to the way the coarse value of RIFD was adjusted. Once the first core die has been adjusted, a second core die may be adjusted, and so on until each of the core die has had the coarse value of their respective RCD1 signals adjusted.

State2 506 may be followed by state3 508, which describes performing a fine adjustment of the first core delay circuit 368 and 354 in each of the core dice. State3 508 may be similar to state2 506, except that a fine portion of RCD1 is adjusted (instead of a coarse portion). The state3 508 may be repeated a number of times for each core die based on a setting of the device. For example, in a 10F mode, the state3 508 may be repeated 9 times. In a 20F mode, the state3 508 may be repeated 19 times.

State3 508 may be followed by state2 510, which may be followed by state3 512. State2 510 and state3 512 describe a coarse and fine (respectively) adjustment of a second core delay. States 510 and 512 may be generally similar to states 506 and 508 respectively, except that in states 510 and 512, the second aligner control circuit 390 may be active and may adjust the signal RCD2 to change an amount of delay in the second core delay circuits 362 and 378.

State3 512 may generally be followed by state 514, which describes a fine alignment of the first and second delay circuits in each of the core dice using a fine alignment process with averaging. State4 514 may be a maintenance state, and may run indefinitely to maintain alignment of the device after the initialization of state0 to state3 502-512. The maintenance state4 514 may continue until conditions are met which cause state5 516 and state6 518 to be entered so that more rapid adjustment of the delays may be made. An example implementation of state 514 are described in more detail in FIG. 6. During state4 514, both the fine values of RCD1 and RCD2 may continue to be adjusted in order to maintain alignment within the memory device. The state4 514 may utilize an averaging system, in which the last several cycles of performing state4 514 are considered. When averaging is used, only if the amount of delay is outside a tolerance for multiple cycles will the value of the delay (e.g., RCD1 and/or RCD2) be adjusted. Each time state4 514 is performed, the state machine may check the delays against an overflow and underflow limit. Based on that comparison, an underflow or overflow flag may be set. For example, if any delay (e.g., the delays in any of the core dice) is below the underflow limit, the underflow flag may be set. If every delay is above the overflow limit then the overflow flag may be set. As long as the underflow and overflow flags are not set, the method 500 may continue to repeat state4 514 indefinitely. Once one of the flags is set, the method 500 proceeds to state5 516.

State5 516 describes performing a fine alignment on the interface delay circuit 316. If the overflow flag was set, then a single fine gate in the interface delay circuit 316 is deactivated (e.g., by decrementing a fine portion of RIFD). If the underflow flag was set, then a single fine gate in the interface delay circuit 316 may be activated (e.g., by incrementing a fine portion of RIFD).

State5 516 may be followed by state6 518. State6 518 describes performing a fine alignment of the first and the second core delay circuits. State6 518 may be generally similar to state4 514, except that in state6 518, averaging is not used. State6 518 may be repeated a set number of times. For example, state6 518 may be repeated 3 times. Other numbers of repeats, or no repeats, e.g., 1, 2, 4, 5, or 10 repeats, may be used in other embodiments. After adjusting the fine delay value in the core dice, state6 518 may also include checking to see if the underflow or overflow conditions are still met. If the underflow conditions are not met, the underflow flag may be unset. If the overflow conditions are not met, the overflow flag may be unset. After repeating a number of times, if neither of the underflow or overflow flags is set, then the method 500 may return to state4 514. If one or both of the underflow and overflow flags is still set, then the method 500 may return to state5 516. An example of the cycle of states 516 and 518 is graphically represented in FIG. 8. An example implementation of state6 518 is described in more detail in FIG. 7.

In some embodiments, the method 500 may include one or more additional conditions for determining how to move between state(s). For example, the method 500 may include repeating state 504 (a fine alignment of the interface delay) until the alignment is complete (e.g., the measured phase difference is within a tolerance) unless the interface delay code (RIFD) has a course portion which indicates that a minimum number of coarse gates are active in the interface delay circuit (e.g., 314). If the code RIFD indicates that a minimum number of coarse delay gates are active, then the state1 504 may be exited, and the method 500 may proceed to state2 506. In a similar manner, while the state4 514 is active, if state4 514 would normally be exited (e.g., because an overflow or underflow condition has been met), but the delay code RCD1 or RCD2 indicates a minimum coarse delay, then the method 500 may remain at state4 514. Similarly, while in state6 518, if the delay codes RCD1 or RCD2 indicate a minimum coarse delay, then the state6 518 may be exited and the method 500 may return to state4 514.

Figure 6:
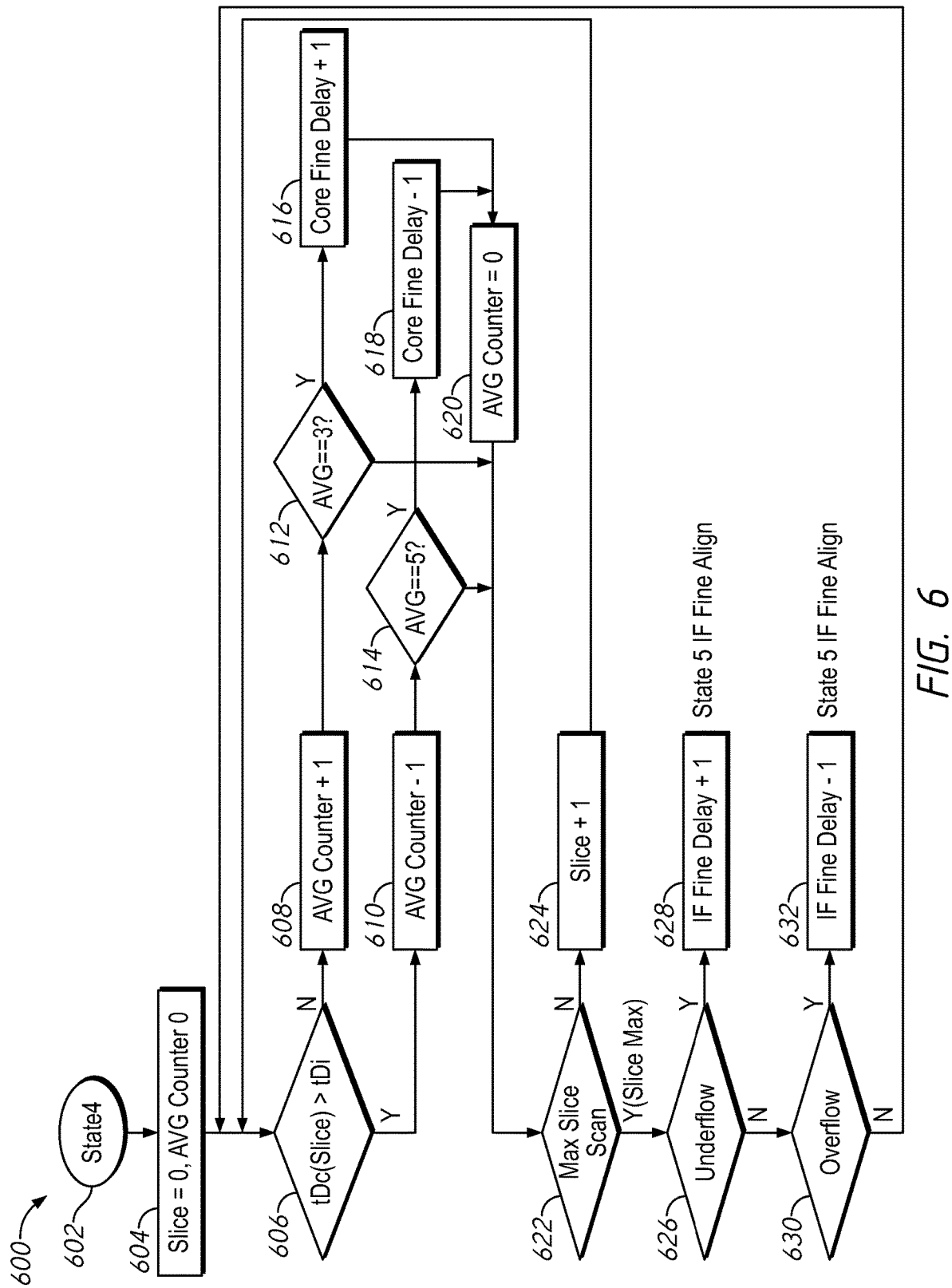
FIG. 6 is a flow chart of a core die fine adjustment process according to some embodiments of the present disclosure.

FIG. 6 is a flow chart of a core die fine adjustment process according to some embodiments of the present disclosure. The method 600 may, in some embodiments, be an implementation of a state 514 implemented by a state machine (e.g., 218 of FIG. 2). The method 600 shows a fourth state in which the first and second aligner control circuits of each of the core die are adjusted using an averaging process.

The method 600 may generally begin with block 602, which describes entering a fourth state of a state machine. For example, state four may be entered from a third state 512 of FIG. 5 or a sixth state 518 of FIG. 5. Block 602 may be followed by block 604, which describes setting a slice counter and an average counter to 0.

Block 604 may be followed by block 606, which describes comparing to determine if a measured delay in a current core die (e.g., a current slice) tDc(slice) is greater than the delay in the interface die tDi. If the slice delay tDc(slice) is smaller or equal to tDi, then the average counter AVG may be incremented, as shown in block 608. Block 608 is followed by block 612, which shows checking to see if the average counter AVG is 3 or not. Other values may be used in other embodiments. If not, then the method may proceed to step 622. If yes, then the core fine delay may be incremented as shown in box 616. For example, the control signals RCD1 and RCD2 may each have a fine portion incremented (to increase the number of fine gates which are active). Box 616 may be followed by box 620, which describes resetting the average counter AVG to 0. Box 620 is followed by box 622.

Returning to box 606, if the core delay tDc(slice) in the current slice is greater than the interface delay tDi, then the method may proceed from box 606 to box 610, which describes decrementing the average counter AVG. If the counter is at 0, and is decremented, it may change to its maximum value (e.g., 7 if it is a binary number). Box 610 may be followed by box 614, which describes checking to see if the average counter is 5 or not (e.g., if it has been decremented three times, starting from 0). Other values may be used in other example embodiments. If not, then the method 600 may proceed to box 622. If yes, then the method 600 may proceed to box 618, which describes decreasing the core delay. For example, the control signals RCD1 and RCD2 may each have a fine portion decremented (to decrease the number of fine gates which are active). Box 618 may be followed by box 620, which describes resetting the average counter to 0. Box 620 is followed by box 622.

Box 622 describes checking the slice counter to determine if a final core die has been adjusted yet. For example, the slice counter may be compared to a threshold which represents the number of core dice. If the last core die has not been reached, then the method 600 proceeds to box 624, in which the slice counter is changed (e.g., incremented) and then the method returns to box 606. If the final core die has been reached, then the method 600 proceeds to box 626.

Box 626 describes determining if an underflow condition has been met. The underflow condition may involve determining if any of the delays are below an underflow limit. For example, determining if any of tDc(slice) for all values of slice or tDc are below an underflow limit. If the underflow condition is met, an underflow flag may be set, and the method 600 may exit the state (e.g., to state 516 of FIG. 5). As described previously, state 516 includes box 628, which describes increasing the number of active fine delay gates in the interface delay circuit 316.

If the underflow condition is not met, then the method 600 may proceed to box 630, which describes determining if an overflow condition has been met. The overflow condition may involve determining if all of the delays are above an overflow limit. For example determining if all of tDc(slice) for all values of slice and tDc are above the overflow limit. If not, the method 600 may return to step 606. If the overflow condition is met, then an overflow flag is set, and the method 600 may exit the state (e.g., to proceed to state 516). As discussed previously, the state 516 includes block 632, which describes decreasing the number of active fine delay gates in the interface delay circuit 316.

In some embodiments the method 600 may include additional conditions. For example, if the delay codes RCD1 and/or RCD2 indicate that a minimum number of coarse gates are active, then the method 600 may include remaining in the fourth state (e.g., repeating back to step 606 regardless of the state of the overflow and underflow flags.

Figure 7:
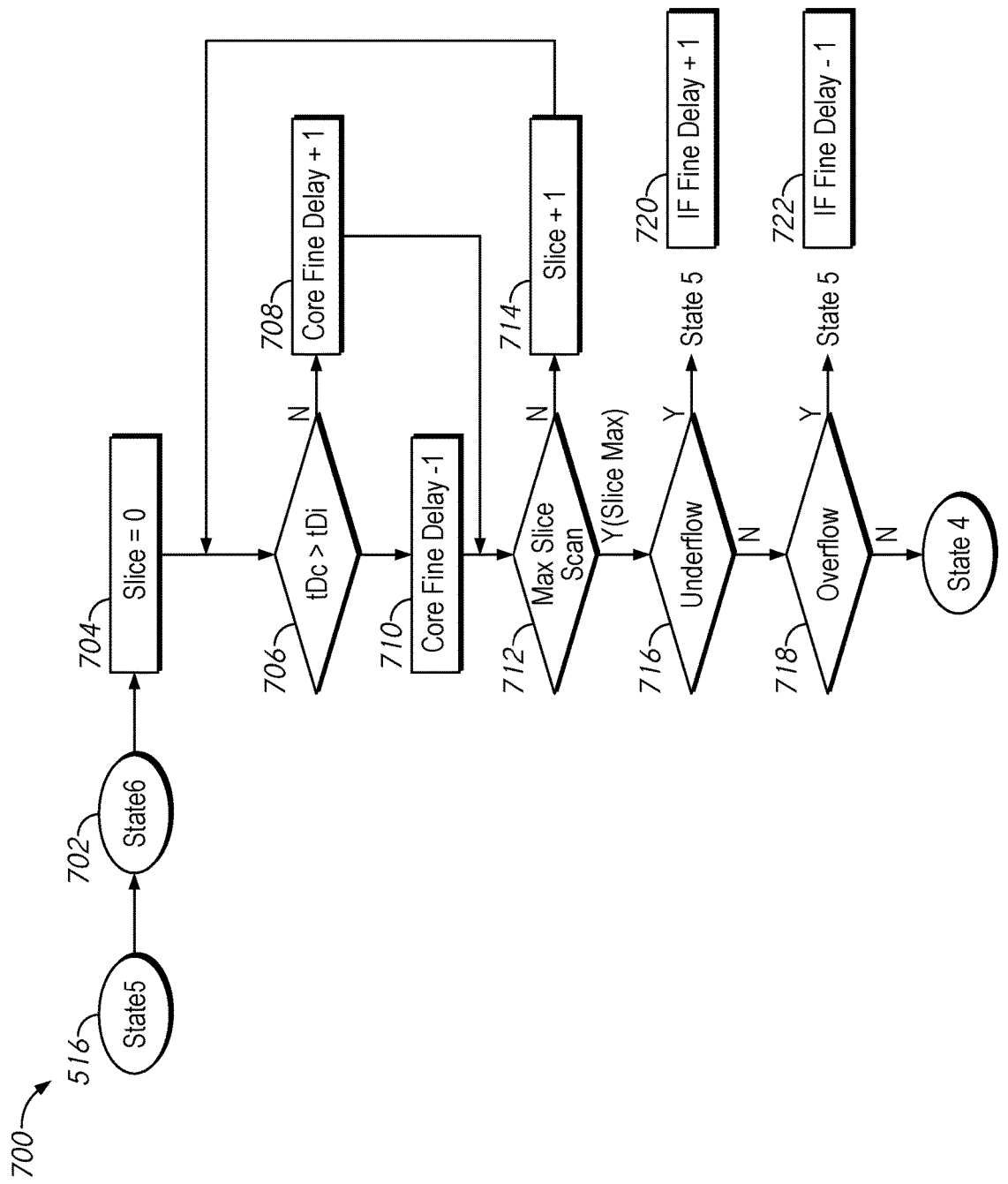
FIG. 7 shows a flow chart of a core die fine adjustment process according to some embodiments of the present disclosure.

FIG. 7 shows a flow chart of a core die fine adjustment process according to some embodiments of the present disclosure. The method 700 may represent a process of adjusting the fine alignment in a core delay (e.g., in fine portions of core delay values RCD1 and RCD2) without averaging. The method 700 may represent an example implementation state6 518 of FIG. 5. The method 700 may generally be similar to the method 600 of FIG. 6, except that in the method 600 averaging is used, while averaging is not used in the method 700. Accordingly, the method 700 may be faster to execute than the method 600.

The method 700 is entered from block 516 which describes the process of state 516, as discussed with respect to FIG. 5. The method 700 may begin with block 702, which describes entering a core die fine alignment without average process (e.g., entering state 518). The method 700 proceeds to box 704 which describes setting a slice counter to 0.

Box 704 is followed by box 706, which describes comparing to determine if a measured delay in a current core die (e.g., a current slice) tDc is greater than the delay in the interface die tDi. If the slice delay tDc is smaller or equal to tDi, then the method proceeds to box 708, which describes increasing the core fine delay, for example by adjusting the signals RCD1 and RCD2 to activate an additional fine gate in the delay circuits 354, 368, 362, and 378. If the slice delay tDc is greater than the interface delay tDi, then method 700 proceeds to box 710, which describes decreasing the core fine delay, for example by adjusting the signals RCD1 and RCD2 to deactivate a fine gate in the delay circuits 354, 368, 362, and 378. After performing either box 708 or 710, the method 700 proceeds to box 712.

Box 712 describes checking to see if a final core die has been adjusted or not. For example, the slice counter may be compared to a value which represents a total number of core die. If the slice counter is below that threshold (indicating that some core die have not yet been adjusted), then the method may proceed to box 714, which describes increasing the slice counter so that boxes 706-710 may be repeated for a new core die. If the final core die has already been checked, then the method 700 may proceed to box 716.

Box 716 describes determining if an underflow condition has been met. The underflow condition may involve determining if any of the delays are below an underflow limit. For example, determining if any of tDc(slice) for all values of slice or tDc are below an underflow limit. In some embodiment, only the coarse value of the delay (e.g., the number of active coarse gates) is used to determine if the underflow condition is met. If the underflow condition is met, an underflow flag may be set, and the method 700 may exit the state (e.g., to state 516 of FIG. 5). As described previously, state 516 includes box 720, which describes increasing the number of active fine delay gates in the interface delay circuit 316.

If the underflow condition is not met, then the method 700 may proceed to box 718, which describes determining if an overflow condition has been met. The overflow condition may involve determining if all of the delays are above an overflow limit. For example determining if all of tDc(slice) for all values of slice and tDc are above the overflow limit. In some embodiment, only the coarse value of the delay (e.g., the number of active coarse gates) is used to determine if the overflow condition is met. If not, the method 700 may exit and return to a different state (e.g., state 514 and/or method 600 of FIG. 6). If the overflow condition is met, then an overflow flag is set, and the method 700 may exit the state (e.g., to proceed to state 516). As discussed previously, the state 516 includes block 722, which describes decreasing the number of active fine delay gates in the interface delay circuit 316.

In some embodiments, the method 700 may also include a counter which determines how many times the process of the method 700 should be performed. In some embodiments, additional conditions may be used to determine how many times the method 700 is repeated before exiting to a different state. For example, if the delay codes RCD1 and/or RCD2 indicate that a minimum number of coarse gates are active, then the method 700 may include immediately exiting the state 518 and returning to a fourth state (e.g., 514 of FIG. 4).

Figure 8:
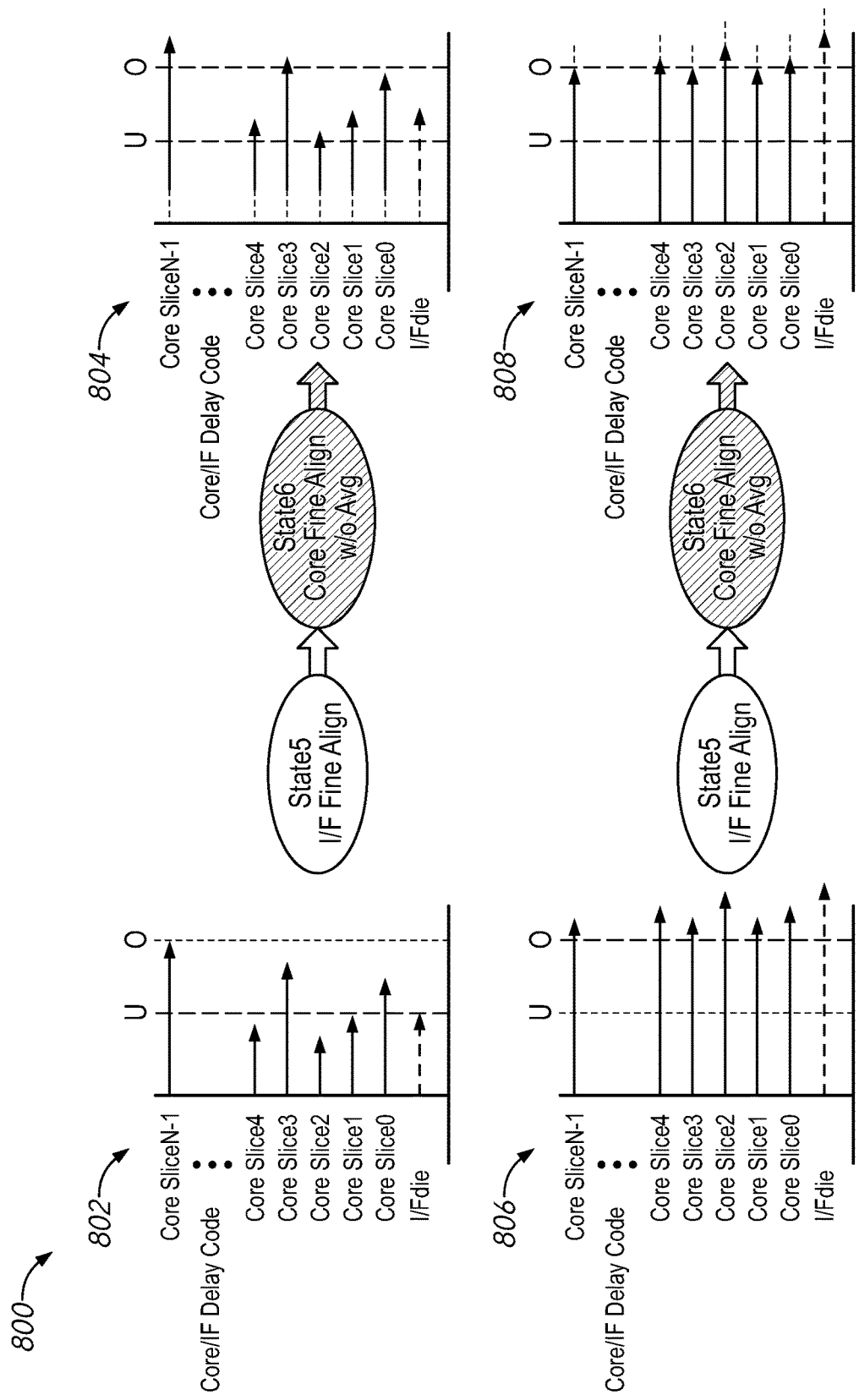
FIG. 8 shows example graphs which represent an operation of overflow and underflow limits according to some embodiments of the present disclosure.

FIG. 8 shows example graphs which represent an operation of overflow and underflow limits according to some embodiments of the present disclosure. The graphs 810-840 show graphical representations of the total amount of delay in the interface die and in each of N core dice (e.g., labelled slice0 to sliceN−1). For example, the graphs 810-840 may represent delays in a memory device such as 100 of FIG. 1, 200 of FIG. 2, 300 of FIGS. 3, and/or 400 of FIG. 4. Each of the graphs 810 to 840 shows delays represented as arrows, with longer arrows representing longer delays. An underflow limit is represented by the vertical dotted line labelled U. An overflow limit is represented by the vertical dotted line labelled O.

In describing the graphs 810-840, reference is made to the state diagram 500 of FIG. 5 as well as to the example implementations of states 4 and 6 described in FIGS. 6 and 7 respectively.

The graphs 810-840 show an example of operating states 5, and 6 (e.g., states 516 and 518) to adjust the delays in the memory device. Graph 810 shows a situation where an underflow condition is met, while the memory is in state 6 or state 4. Since at least one of the interface and core dice has a delay which is below the underflow limit U (e.g., slice2 and slice 4), an underflow flag may be set in state 4 (e.g., in box 626 of FIG. 6) or in state 6 (e.g., in box 716 of FIG. 7). Since an underflow flag is set, state 5 may be entered. Graph 820 shows a representation of the delays shown in graph 810 after they have been adjusted by states 5 and 6 (e.g., states 516 and 518 of FIG. 5).

Since the underflow flag was set, state 5 may be entered, and the delay in the interface die may be increased, as represented by the dots along the arrow which represents the interface die delay (I/Fdie) in graph 820. During state 6, delays may be adjusted in each of the core dice, until the underflow condition is no longer met and the state machine returns to state 4 (e.g., states 514 of FIGS. 5 and/or 600 of FIG. 6). For example, as described with respect to the box 716 of FIG. 7, when none of the delays are below the underflow limit U, the underflow condition is no longer met. As may be seen from the graph 720, all of the delays have been adjusted (as shown by the dotted segments) and are now above the underflow limit U. In the example of graph 710 to 720, all of the core die delays have been increased. It may take multiple loops of states 5 and 6 to make sure the underflow condition is no longer met. Once the underflow condition (and overflow condition) is no longer met, state 6 may be exited by returning the state machine to state 4.

Graphs 830 and 840 are generally similar to graph 810 and 820, except that the graphs 830 and 840 represent changing delays when an overflow condition is met. In the graph 810, all of the delays are longer than an overflow limit O, and thus an overflow condition is met. Accordingly, in states 4 or 6, when the overflow condition is met (e.g., as detected in boxes 630 or 730 respectively), the state machine may proceed to state 5 (e.g., 516 in FIG. 5) and then to state 6 (e.g., 518 of FIG. 5). As represented by the horizontal segments, in state 5, the interface die delay may be reduced, followed by the delays in the core dice being adjusted in state 6, until the overflow condition is no longer met. As shown in graph 840, the overflow condition is no longer met when at least one of the delays is below the overflow limit O (e.g., core slices 1, 3, and N−1 of example graph 840). It may take multiple loops of states 5 and 6 to make sure the overflow condition is no longer met. Once the overflow condition (and underflow condition) is no longer met, the state machine may return to state 4 (e.g., 514 of FIG. 4).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    an interface die comprising:
        an interface delay circuit; and
        an interface aligner control circuit configured to set a delay time of the interface delay circuit; and
    a plurality of core dice stacked on the interface die, each of the plurality of core dice comprising:
        a first core delay circuit;
        a first aligner control circuit configured to set a delay time of the first core delay circuit;
        a second core delay circuit; and
        a second aligner control circuit configured to set a delay time of the second core delay circuit,
    wherein the first core delay circuit provides a first delayed oscillator signal based on a received oscillator signal,
    wherein the interface delay circuit provides an interface delayed oscillator signal based on the received oscillator signal,
    the interface die further comprising a first phase detector configured to provide a first measured difference signal based on measured difference between the first delayed oscillator signal and the interface delayed oscillator signal, wherein the first aligner control circuit is configured to set the delay time of the first core delay circuit based on the first measured difference signal.

2. The apparatus of claim 1, wherein the interface die further comprises a clock tree configured to receive the delayed oscillator signal and provide the delayed oscillator signal to the first phase detector.

3. The apparatus of claim 1, wherein the second core delay circuit provides a second delayed oscillator signal based on the first delayed oscillator signal,
    wherein each of the plurality of core dice provides data with timing based on the first delayed oscillator signal,
    the interface die further comprising a second phase detector configured to provide a second measured difference signal based on a measured difference between the data and the second delayed oscillator signal, wherein the second aligner control circuit is configured to set the delay time of the second core delay circuit based on the second measured difference signal.

4. The apparatus of claim 3, wherein the interface aligner control circuit is configured to set the delay time of the interface delay circuit based, in part, on the first measured difference signal and the second measured difference signal.

5. The apparatus of claim 3, wherein each of the plurality of core dice further comprises:
    a first set and hold delay circuit configured to receive the first delayed oscillator signal from the first core delay circuit and provide the first delayed oscillator signal to the second core delay circuit;
    a clock tree configured to receive the first delayed oscillator signal from the first set and hold delay circuit; and
    a latch configured to provide the data to the second phase detector circuit with timing based on the first delayed oscillator signal provided from the clock tree.

6. An apparatus comprising:
    an interface die comprising:
        an interface delay circuit; and
        an interface aligner control circuit configured to set a delay time of the interface delay circuit; and
    a plurality of core dice stacked on the interface die, each of the plurality of core dice comprising:
        a first core delay circuit;

a first aligner control circuit configured to set a delay time of the first core delay circuit;

a second core delay circuit;

a second aligner control circuit configured to set a delay time of the second core delay circuit;

a third core delay circuit configured to receive a read clock and provide a first delayed read clock signal, wherein the first aligner control circuit is configured to set a delay time of the third core delay circuit to match the delay time of the first core delay circuit; and a fourth core delay circuit configured to receive the first delayed read lock signal and provide a second delayed read clock signal, wherein the second aligner control circuit is configured to set a delay time of the fourth core delay circuit to match the delay time of the second core delay circuit.

7. The apparatus of claim 6, wherein the interface die comprises a latch configured to latch read data provided by one of the plurality of core dice with timing based on the second delayed read clock signal.

8. The apparatus of claim 1, further comprising a state machine configured to set the delay times of the interface aligner control and the first and the second aligner delay control in each of the plurality of core dice.

9. An apparatus comprising:
an interface die comprising:
an interface delay circuit;
an interface aligner control circuit configured to set a delay time of the interface delay circuit; and
a second interface delay circuit configured to receive a write clock and provide a delayed write clock, and wherein the interface aligner control circuit is configured to set a delay time of the second interface delay circuit to match the delay time of the interface delay circuit; and a plurality of core dice stacked on the interface die, each of the plurality of core dice comprising:
a core delay circuit; and
a core aligner control circuit configured to set a delay time of the core delay circuit.

10. The apparatus of claim 9, wherein the interface delay circuit and the core delay circuit are coupled to a oscillator signal along a replica path, and wherein the second interface delay circuit and the interface aligner control circuit are along a native path.

11. The apparatus of claim 9, wherein the interface delay circuit and the core delay circuit are coarse and fine delay circuits.

12. An apparatus comprising:
an interface die comprising:
an interface delay circuit; and
an interface aligner control circuit configured to set a delay time of the interface delay circuit; and a plurality of core dice stacked on the interface die, each of the plurality of core dice comprising:
a core delay circuit; and
a core aligner control circuit configured to set a delay time of the core delay circuit, wherein the interface delay circuit is configured to receive an oscillator signal and provide an interface delayed oscillator signal, wherein the core delay circuit is configured to receive the oscillator signal and provide a core delayed oscillator signal, wherein the core die further comprises a phase detector configured to provide a phase difference signal based on the timing of the core delayed oscillator signal.

13. The apparatus of claim 12, wherein the core aligner control circuit and the interface aligner control circuit are configured to set the delay time of the core die and the delay time of the interface delay circuit respectively based on the phase difference signal.

14. A method comprising:
measuring each of a plurality of adjustable delays each of which is associated with one of a plurality of core dice or an interface die, wherein the plurality of core dice are stacked on an interface die;

setting an underflow flag responsive to any of the plurality of delays being less than an underflow limit;

setting an overflow flag responsive to all of the plurality of delays being greater than an overflow limit; and adjusting the delay in the interface die and in the plurality of core dice responsive to the underflow flag or the overflow flag being set.

15. The method of claim 9, wherein adjusting the delay includes:
adjusting the delay in the interface die;
increasing, for each of the plurality of the core dice, the delay in one of the plurality of core dice if the delay is less than or equal to the delay in the interface die; and
decreasing, for each of the plurality of the core dice, the delay in the one of the plurality of core dice if the delay is less than or equal to the delay in the interface die.

16. The method of claim 14, further comprising:
clearing the overflow flag if all of the plurality of delays are greater than the underflow limit;
clearing the underflow flag if any of the plurality of delays are less than the overflow limit; and
repeating the adjusting delay in the interface die and in the plurality of core dice until the overflow flag and the underflow flag are cleared.

17. The method of claim 16, further comprising:
adjusting the delay in the plurality of core dice with averaging when the underflow flag and the overflow flag are not set; and
adjusting the delay in the plurality of core dice without averaging when the underflow flag or the overflow flag are set.

18. The method of claim 14, further comprising adjusting the plurality of adjustable delays before measuring each of the plurality of adjustable delays.

* * * * *